United States Patent
Chiu et al.

(10) Patent No.: US 10,629,802 B1
(45) Date of Patent: Apr. 21, 2020

(54) MAGNETORESISTANCE DEVICE AND METHOD FOR FORMING THE SAME

(71) Applicant: UNITED MICROELECTRONICS CORP., Hsin-Chu (TW)

(72) Inventors: Chiu-Jung Chiu, Tainan (TW);
Yu-Chun Chen, Kaohsiung (TW);
Ya-Sheng Feng, Tainan (TW);
Hung-Chan Lin, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/175,854

(22) Filed: Oct. 31, 2018

(30) Foreign Application Priority Data

Sep. 28, 2018 (CN) .......................... 2018 1 1137949

(51) Int. Cl.
| | | |
|---|---|---|
| H01L 27/22 | (2006.01) | |
| H01L 43/02 | (2006.01) | |
| H01L 43/10 | (2006.01) | |
| H01L 43/12 | (2006.01) | |
| G11C 11/16 | (2006.01) | |

(52) U.S. Cl.
CPC ............ *H01L 43/02* (2013.01); *G11C 11/161* (2013.01); *H01L 27/222* (2013.01); *H01L 43/10* (2013.01); *H01L 43/12* (2013.01); *G11C 2211/5615* (2013.01)

(58) Field of Classification Search
CPC .............................. H01L 27/224; H01L 43/08
See application file for complete search history.

(56) References Cited

U.S. PATENT DOCUMENTS

| | | | |
|---|---|---|---|
| 6,440,815 B1 * | 8/2002 | Mitsuhashi | H01L 28/55 257/E21.009 |
| 8,866,242 B2 | 10/2014 | Li | |
| 9,818,935 B2 | 11/2017 | Chuang | |
| 9,837,603 B1 * | 12/2017 | Deshpande | H01L 43/08 |
| 10,355,198 B2 * | 7/2019 | Liao | H01L 43/02 |
| 2005/0124112 A1 * | 6/2005 | Hsu | G11C 13/0007 438/250 |
| 2012/0153413 A1 * | 6/2012 | Xi | H01L 43/08 257/421 |
| 2017/0117467 A1 * | 4/2017 | Chang | H01L 45/08 |
| 2018/0138237 A1 * | 5/2018 | Yakabe | H01L 27/228 |
| 2018/0366517 A1 * | 12/2018 | Lin | H01L 27/228 |
| 2018/0366638 A1 * | 12/2018 | Lin | H01L 43/08 |
| 2019/0088864 A1 * | 3/2019 | Cho | H01L 43/12 |

* cited by examiner

*Primary Examiner* — George R Fourson, III
(74) *Attorney, Agent, or Firm* — Winston Hsu

(57) ABSTRACT

A magnetoresistance device is disclosed, comprising a bottom electrode, a magnetic tunneling junction (MTJ) disposed on the bottom electrode, a top electrode disposed on the magnetic tunneling junction, a first spacer disposed on the magnetic tunneling junction and covering a sidewall of the top electrode, and a second spacer disposed on the first spacer and conformally covering along a sidewall of the first spacer, a sidewall of the magnetic tunneling junction and a sidewall of the bottom electrode.

19 Claims, 5 Drawing Sheets

MAGNETORESISTANCE DEVICE AND METHOD FOR FORMING THE SAME

BACKGROUND OF THE INVENTION

1. Field of the Invention

The present invention generally related to a magnetoresistance device and method for forming the same, and more particularly related to a magnetoresistive random access memory (MRAM) and method for forming the same.

2. Description of the Prior Art

A magnetoresistive random access memory (MRAM) is a kind of non-volatile memory that has drawn a lot of attention in this technology field recently regarding its potentials of incorporating advantages of other kinds of memories. For example, a MRAM device may have an operation speed comparable to SRAMs, the non-volatile feature and low power consumption comparable to flash, the high integrity and durability comparable to DRAM. More important, the process for forming a MRAM device may be conveniently incorporated into existing semiconductor manufacturing processes.

Unlike conventional memories that store data by electric charge or current flow, a MRAM device stores data by using a magnetoresistance element called magnetic tunnel junction (MTJ), which typically comprises two ferromagnetic layers separated by a thin insulating layer and is sandwiched between a top electrode and a bottom electrode. When the thickness of the insulating layer is sufficiently thin, quantum-mechanical tunneling of electrons may occur between the two ferromagnetic layers. The tunneling process of the electrons is electron spin dependent, which means that the magnitude of the tunneling current across the MTJ is a function of the relative magnetic polarities of the two ferromagnetic layers. The dependence of the tunneling current on the magnetization of the ferromagnetic layers is known as tunneling magnetoresistance (TMR) effect. The MTJ of a MRAM usually has one of the two ferromagnetic layers being pinned (fixed) to a particular magnetic polarity, while the magnetic polarity of the other ferromagnetic layer may be changed by an external magnetic field. If the two ferromagnetic layers have the same magnetization direction, the electrons are more likely to tunnel through the insulating layer, resulting in a larger tunneling current and MTJ is considered in a low-resistance state. If the two ferromagnetic layers have opposite magnetization directions, the electrons are less likely to tunnel through the insulating layer, resulting in a smaller tunneling current and the MTJ is considered in a high-resistance state. The two different resistance states of the MTJ are used to represent data "0" or "1", respectively.

Currently, there are still many problems confronted when manufacturing a MRAM. For example, inline misalignment or critical dimension (CD) variation would cause an insufficient contacting area between the bottom electrode of the magnetoresistance element and an underlying interconnecting structure, resulting in a high series resistance that may obstruct the MRAM to function properly. Furthermore, misalignment or CD variation may also increase the risk of exposing the underlying interconnecting structure to the MTJ etching process and cause tool contamination. Therefore, there is still a need in the field to provide a novel MRAM device and method for forming the same that have a larger process window and is able to prevent the aforesaid problems.

SUMMARY OF THE INVENTION

In light of the above, the present invention is directed to provide a magnetoresistance device and method for forming the same which may overcome the aforesaid technical problems of existing MRAM.

According to one embodiment of the present invention, a magnetoresistance device is disclosed. The magnetoresistance device according to the present invention comprises a bottom electrode, a magnetic tunneling junction (MTJ) disposed on the bottom electrode, a top electrode disposed on the magnetic tunneling junction, a first spacer disposed on the magnetic tunneling junction and covering a sidewall of the top electrode, and a second spacer disposed on the first spacer and conformally covering along a sidewall of the first spacer, a sidewall of the magnetic tunneling junction and a sidewall of the bottom electrode.

According to another embodiment of the present invention, a method for forming a magnetoresistance device is disclosed, which comprises the following steps. First, a first dielectric layer is provided. A bottom electrode layer is formed on a top surface of the first dielectric layer. A magnetic tunneling junction (MTJ) material layer is formed on the bottom electrode layer. A top electrode is then formed on the magnetic tunneling junction material layer, and a first spacer material layer is formed conformally covering the top electrode and the magnetic tunneling junction material layer exposed from the top electrode. Subsequently, a first etching process is performed to etch the first spacer material layer, the magnetic tunneling junction material layer and the bottom electrode layer until exposing the first dielectric layer, thereby forming a bottom electrode, a magnetic tunneling junction and a first spacer on the magnetic tunneling junction and covering a sidewall of the top electrode. Thereafter, a second spacer material layer is formed conformally covering the first spacer, the magnetic tunneling junction, the bottom electrode and an exposed portion of the first dielectric layer. Afterward, a second etching process is performed to etch the second spacer to form a second spacer covering on a sidewall of the first spacer, a sidewall of the magnetic tunneling junction and a sidewall of the bottom electrode.

It is one feature of the present invention that after forming the top electrode, the MTJ and the bottom electrode of the magnetoresistance device are formed by using the top electrode and the first spacer on the sidewall of the top electrode as an etching mask. In this way, the bottom electrode may be formed with a width larger than the width of the top electrode to ensure that the underlying interconnecting structure electrically coupled to the MTJ may be completely covered by the bottom electrode without any additional photomask and patterning process. Furthermore, the width of the bottom electrode may be conveniently adjusted by adjusting the thickness of the first spacer to compensate the misalignment or CD variation when forming the top electrode, ensuring that the underlying interconnecting structure is completely covered. A largest contacting area between the bottom electrode and the underlying interconnecting structure and a smaller series resistance may be guaranteed. The exposure of the underlying interconnecting structure to the etching process for forming the MTJ and the bottom electrode is also prevented.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to those of ordinary skill in the art, several exemplary embodiments of the present invention will be detailed as follows, with reference to the accompanying drawings using numbered elements to elaborate the contents and effects to be achieved. The accompanying drawings are included to provide a further understanding of the embodiments, and are incorporated in and constitute a part of this specification. These embodiments are described in sufficient detail to enable those skilled in the art to practice the invention. Other embodiments may be utilized and that structural, logical and electrical changes may be made without departing from the spirit and scope of the present invention.

Figure 1:
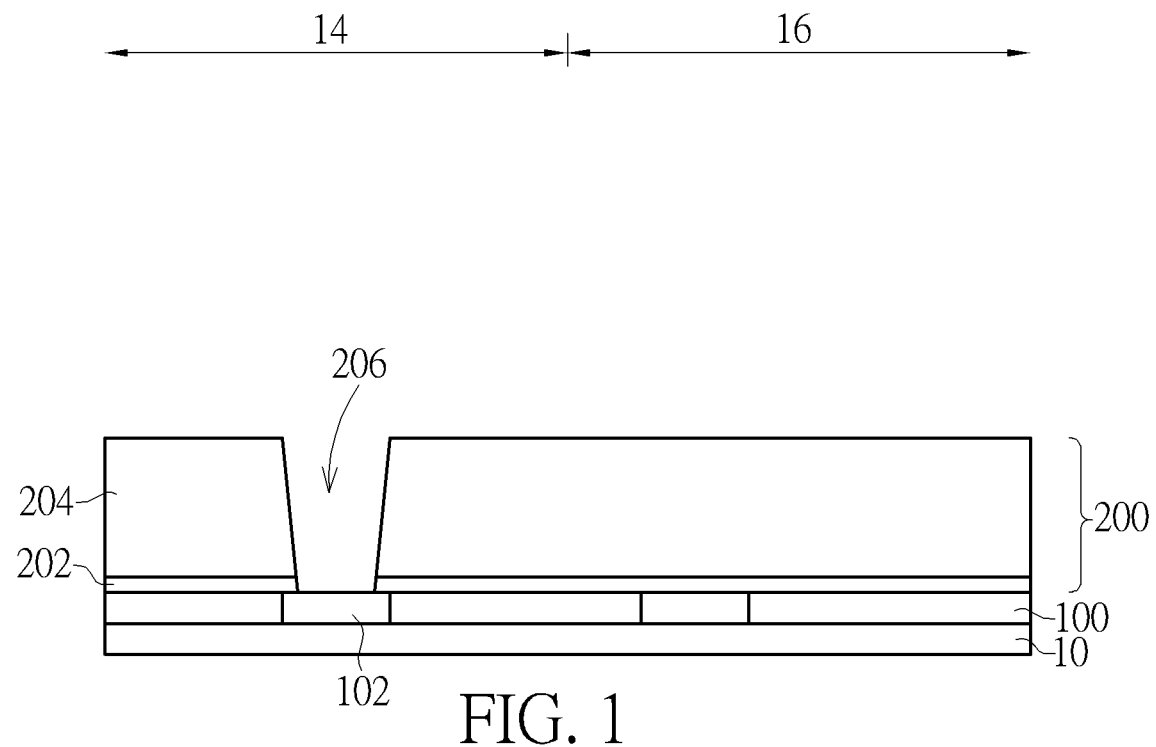
FIG. 1 to FIG. 10 are schematic diagrams illustrating the steps of forming a magnetoresistive random access memory (MRAM) device according to a preferred embodiment of the present invention.

Please refer to FIG. 1. First, a substrate 10 having a cell region 14 and a peripheral region 16 defined thereon is provided. The substrate 10 may be a silicon substrate, a silicon-on-insulator (SOI) substrate, or Group III-V semiconductor substrate, but not limited thereto. The substrate 10 may have semiconductor structures (not shown), such as transistors, capacitors, resistors, inductors, or interconnecting structures, formed therein. For the sake of simplicity, the above-mentioned semiconductor structures are not illustrated in the drawings. An interlayer dielectric layer 100 is disposed on the substrate 10. The interlayer dielectric layer 100 may comprise dielectric material such as silicon oxide, silicon oxynitride, silicon nitride, or low-k dielectric materials such as fluorinated silica glass (FSG), silicon oxycarbide (SiCOH), spin on glass, porous low-k dielectric material or organic dielectric polymers, or a combination thereof, but not limited thereto. Bottom interconnecting structures 102 may be formed in the interlayer dielectric layer 100 in the cell region 14 and in the peripheral region 16. The bottom interconnecting structures 102 may be metal interconnecting structures comprising metal, such as tungsten, copper, aluminum, or other suitable low-resistance metals. Preferably, the bottom interconnecting structures 102 comprise copper. Afterward, an interlayer dielectric layer 200 is formed on the interlayer dielectric layer 100. The interlayer dielectric layer 200 may have a multi-layered structure, including an etching stop layer 202 and a first dielectric layer 204 on the etching stop layer 202. The etching stop layer 202 may comprise silicon nitride (SiN), silicon carbon nitride (SiCN) or silicon oxynitride (SiON), or a combination thereof, but not limited thereto. The first dielectric layer 204 may comprise dielectric material such as such as silicon oxide, silicon oxynitride, silicon nitride, or low-k dielectric materials, including fluorinated silica glass (FSG), silicon oxycarbide (SiCOH), spin on glass, porous low-k dielectric material or organic dielectric polymers, or a combination thereof, but not limited thereto. Subsequently, a pattern process, such as a photolithography-etching process may be carried out to define a contact opening 206 in the interlayer dielectric layer 200 in the cell region 14, which penetrates through the etching stop layer 202 and the first dielectric layer 204 and exposes a top surface of the underlying bottom interconnecting structure 102.

Figure 2:
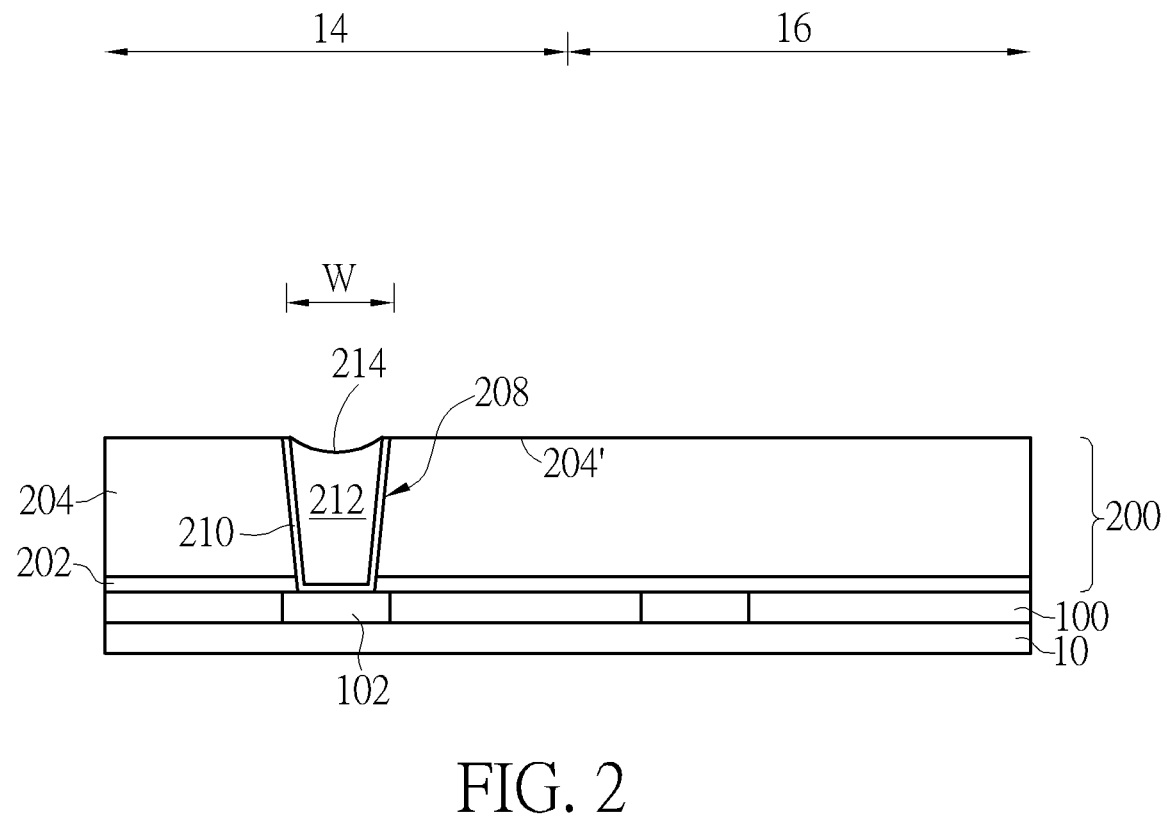

Please refer to FIG. 2. Subsequently, a barrier layer 210 is formed on the interlayer dielectric layer 200 and conformally covers the sidewalls of the contact opening 206 and the exposed top surface of the bottom interconnecting structure 102. A conductive material 212 is then formed on the barrier layer 210 and completely fills the contact opening 206. After removing unnecessary barrier layer 210 and conductive material 212 outside the contact opening 206 by, for example, performing a chemical mechanical polishing (CMP) process, the remaining barrier layer 210 and the conductive material 212 filling in the contact opening 206 become the contact plug 208. According to an embodiment, the barrier layer 210 may be single layered or multiple-layered and may comprise titanium (Ti), tantalum (Ta), titanium nitride (TiN), tantalum nitride (TaN), or a combination thereof, but not limited thereto. The conductive material 212 may comprise metal such as tungsten, copper or aluminum or other suitable low-resistance metals, but not limited thereto. Preferably, the conductive material 212 comprise copper. The contact plug 208 is to electrically connect the bottom interconnecting structures 102 and the bottom electrode 322 (shown in FIG. 6) of the magnetoresistive device. The contact plug 208 exposed form the interlayer dielectric layer 200 may have a width W. According to an embodiment, the conductive material 212 of the contact plug 208 may be slightly over-polished during the chemical mechanical polishing (CMP) process to form a recessed top surface 214. The recessed top surface 214 of the contact plug 208 may provide a larger contacting area for the bottom electrode 322 to reduce the contacting resistance and also forms a more secured joining between the contact plug 208 and the bottom electrode 322.

Figure 3:
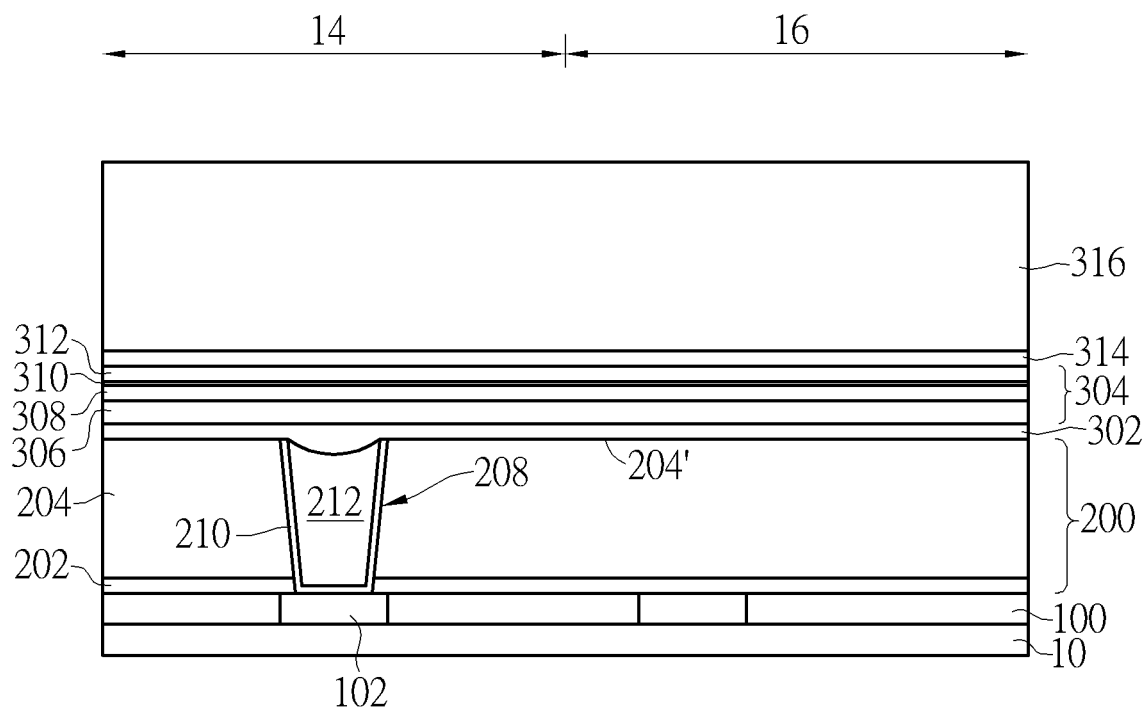

Please refer to FIG. 3. After forming the contact plug 208, a bottom electrode layer 302, a pinning layer 306, a pinned layer 308, a tunneling layer 310, a free layer 312, a cap layer 314 and a top electrode layer 316 are successively formed on the interlayer dielectric layer 200. According to an embodiment, the bottom electrode layer 302 and the top electrode layer 316 may comprise a same or different conductive material such as titanium, tantalum, titanium nitride, tantalum nitride or a combination thereof, but not limited thereto. The cap layer 314 may comprise a metal or a metal oxide such as aluminum (Al), magnesium (Mg), tantalum (Ta), ruthenium (Ru), tungsten dioxide ($WO_2$), NiO, MgO, $Al_2O_3$, $Ta_2O_5$, $MoO_2$, $TiO_2$, GdO, or MnO, or a combination thereof, but not limited thereto. The pinning layer 306 is disposed on the bottom electrode layer 302 and may comprise anti-ferromagnetic (AFM) material such as PtMn, IrMn, PtIr or the like. The pinned layer 308 and the free layer 312 respectively comprise a same or different ferromagnetic material such as Fe, Co, Ni, FeNi, FeCo, CoNi, FeB, FePt, FePd, CoFeB, or the like. The magnetic polarity of the pinned layer 308 is pinned (anti-ferromagnetic coupled) to a fixed orientation by the pinning layer 306 thereunder. The magnetic polarity of the free layer 312 may be changed by an external magnetic field. The tunneling layer 310 is sandwiched between the pinned layer 308 and the free layer 312 and may comprise insulating material such as MgO, $Al_2O_3$, NiO, GdO, $Ta_2O_5$, $MoO_2$, $TiO_2$, $WO_2$, or the like. The pinning layer 306, the pinned layer 308, the tunneling layer 310 and the free layer 312 together form a magnetic tunneling junction (MTJ) material layer 304 between the top electrode layer 316 and the bottom electrode layer 302 and may respectively comprise single or multiple layers having a thickness ranges from several angstroms to dozens of nanometers.

Figure 4:
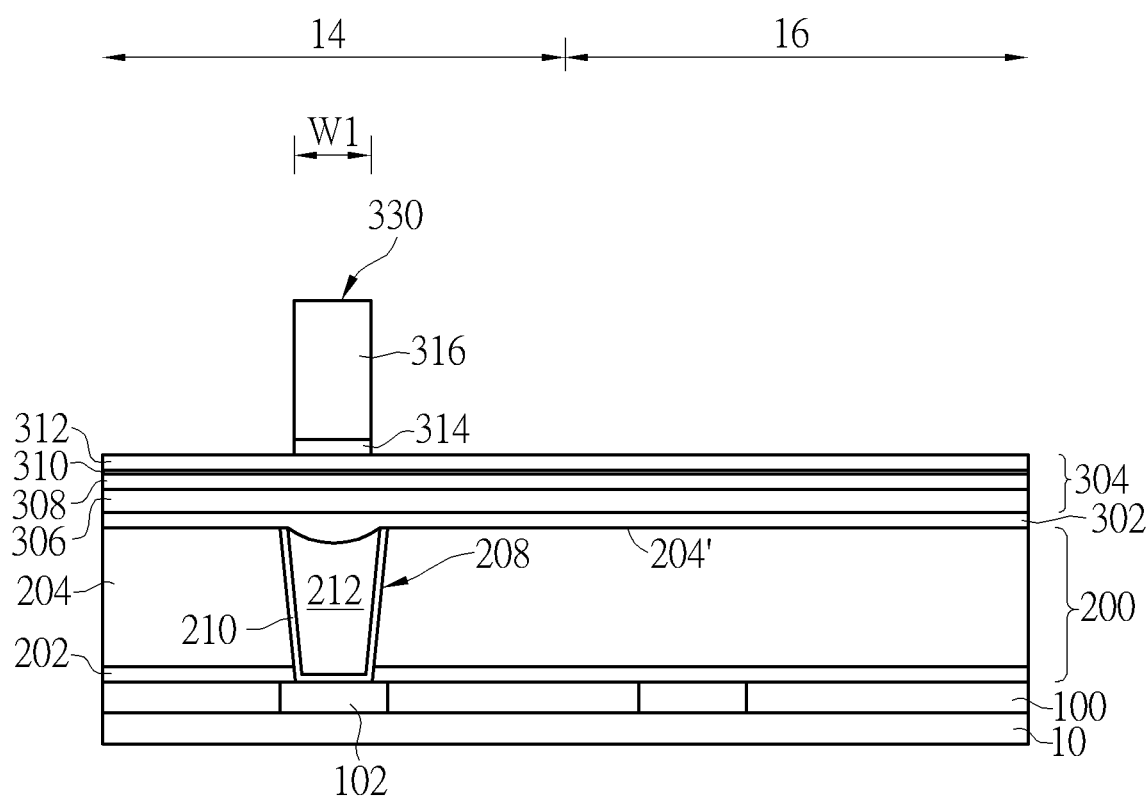

Please refer to FIG. 4. Following, a patterning process may be performed to pattern the top electrode layer 316 into a top electrode 330. The patterning process may include forming a patterned mask layer (not shown) comprising a designed pattern of the top electrode 330 on the top electrode layer 316 and then performing an etching process, such as an reactive ion etching (RIE) process, using the patterned mask layer as an etching mask to etch the top electrode layer 316, thereby transferring the designed pattern to the electrode layer 316 to form the top electrode 330. The cap layer 314 not covered by the top electrode 330 may also be removed when etching the top electrode layer 316. A portion of the MTJ material layer 304 is therefore exposed. As shown in FIG. 4, the top electrode 330 and the remaining cap layer 314 sandwiched between the top electrode 330 and the MTJ material layer 304 has vertically aligned sidewalls and a same width W1.

Figure 5:
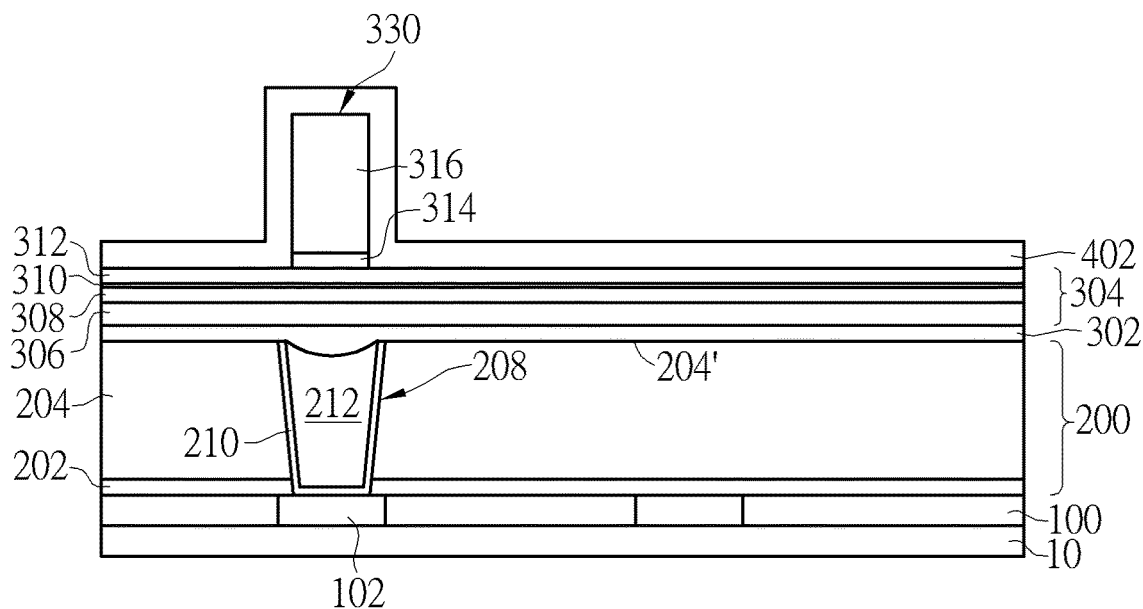

Please refer to FIG. 5. After forming the top electrode 330, a first spacer material layer 402 is formed on the substrate 10 and conformally covers the top surface and sidewall of the top electrode 330, the sidewall of the cap layer 314 and the exposed portion of the MTJ material layer 304. According to an embodiment, the first spacer material layer 402 may comprise insulating material, such as SiN, SiON, SiCN or a combination thereof, but not limited thereto. The first spacer material layer 402 may be single-layered or multiple-layered.

Figure 6:
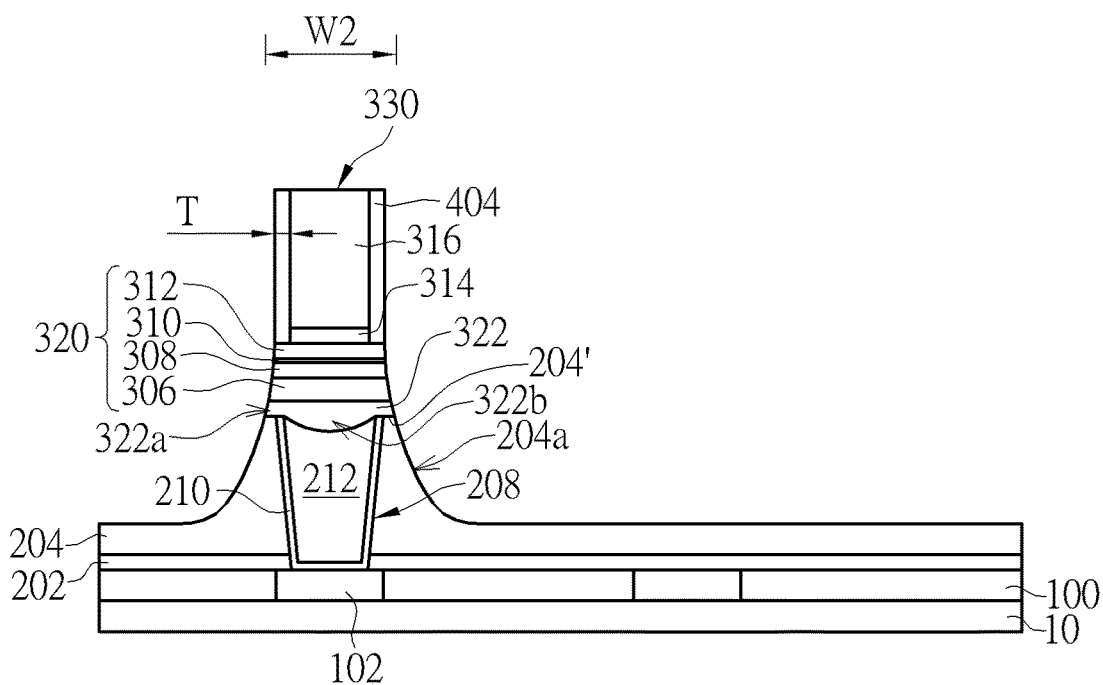

Please refer to FIG. 6. After forming the first spacer material layer 402, a first etching process is carried out to etch the first spacer material layer 402, the MTJ material layer 304 and the bottom electrode layer 302, thereby forming a bottom electrode 332, a MTJ 320 on the bottom electrode 322 and a first spacer 404 on the MTJ 320, covering the sidewall of the top electrode 330 and a portion of the MTJ 320 adjacent to the sidewall of the top electrode 330. Notably, the first spacer 404 may have a sidewall aligned with the sidewall of the MTJ 320 and does not cover the sidewall of the MTJ 320 and the sidewall of the bottom electrode. According to an embodiment, the first etching process may comprise performing an anisotropic etching process, such as an ion beam etching (IBE) process, by which the uppermost first spacer material layer 402 is first etched to form the first spacer 404 that is self-aligned to the sidewall of the top electrode 330. Continuously, using the top electrode 330 and the first spacer 404 as the etching mask, the underlying MTJ material layer 304 and the bottom electrode layer 302 are in-situ etched to form the MTJ 320 and the bottom electrode 322. However, in other embodiments, the first etching process may comprise performing multiple anisotropic etching processes successively. For example, a reactive ion beam (RIE) process may be first performed to etch the first spacer material layer 402 to form the first spacer 404, and then an ion beam etching (IBE) process is performed, using the top electrode 330 and the first spacer 404 as an etching mask to etch the underlying MTJ material layer 304 and the bottom electrode layer 302 to form the MTJ 320 and the bottom electrode 322.

During the first etching process, the first dielectric layer 204 exposed from the bottom electrode 322 may be over-etched to form a first recessed top surface 204a that borders the top surface 204' of the first dielectric layer 204 covered by the bottom electrode 322 and extends downwardly to be lower than the top surface 204'. The first recessed top surface 204a and the sidewall of the bottom electrode 322 collectively form a continuous curved surface. Furthermore, the sidewall of the first spacer 440, the sidewall of the MTJ 320 and the sidewall of the bottom electrode 322 may also forma continuous surface. According to an embodiment, the over-etched thickness (the height between the top surface 204' and the horizontal portion of the first recessed top surface 204a) of the first dielectric layer 204 may range from 0 to 250 angstroms. Preferably, a sufficient thickness of the first dielectric layer 204 is over-etched during the first etching process in order to provide a taper portion of the first recessed top surface 204a which the second spacer 408 (shown in FIG. 8) may be formed self-aligned to.

It is one feature of the present invention that, as shown in FIG. 6, by using the top electrode 330 and the first spacer 440 as the etching mask to define the MTJ 320 and the bottom electrode 322, the width W2 of the MTJ 320 and the bottom electrode 322 would be larger than the width W1 of the top electrode 330 by approximately be the sum of the thickness T of the first spacer 404 on two sides of the top electrode 330. In this way, advantageously, when inline misalignment or CD variation happens, the contact plug 208 may still be completely covered by the bottom electrode 322 from being exposed to the first etching process. Additionally, the width W2 of the bottom electrode 322 may be flexibly adjusted by simply adjusting the thickness T of the first spacer 404. A largest contacting area and smallest contact resistance between the bottom electrode 322 and the contact plug 208 may also be ensured. Tool contamination due to exposure of the contact plug 208 during the first etching process may also be prevented.

It is another feature of the present invention that, as shown in FIG. 6, the bottom electrode 322 may have a saucer-plate-shaped cross-sectional profile, having a central portion 322b overlapping vertically on the recessed top surface 214 of the contact plug 208 and an edge portion 322a overlapping vertically on the top surface 204' of the first dielectric layer 204 adjacent to the contact plug 208. The saucer-plate-shape of the bottom electrode 322 may further increase the contacting area between the bottom electrode 322 and the contact plug 208 and also forms a stronger interface between the bottom electrode 322 and the contact plug 208.

Figure 7:
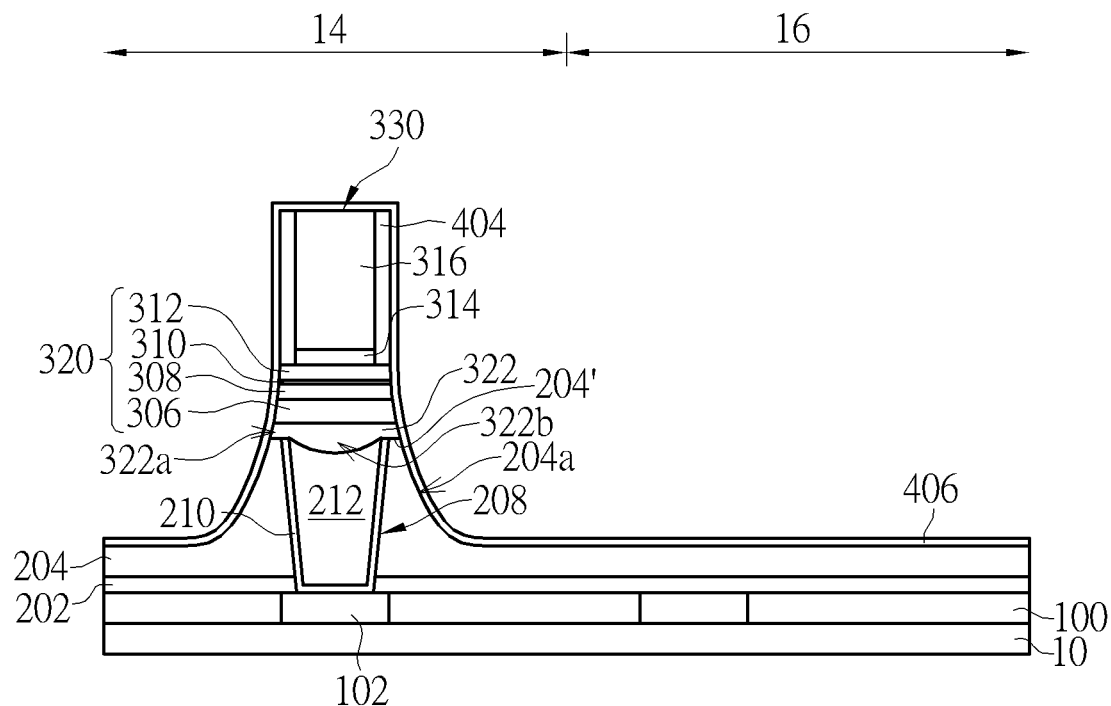

Please refer to FIG. 7. Subsequently, a second spacer material layer 406 is formed on the substrate 10, conformally covering the top surface of the top electrode 330, the sidewall of the first spacer 404, the sidewall of the MTJ 320, the sidewall of the bottom electrode 322 and the first recessed top surface 204a of the first dielectric layer 204. According to an embodiment, the second pacer material layer 406 may be made of an insulating material, such as SiN, SiON, SiC or SiCN, or a combination thereof, but not limited thereto. The first spacer material layer 402 and the second spacer material layer 406 may be made of a same insulating material, such as SiN.

Figure 8:
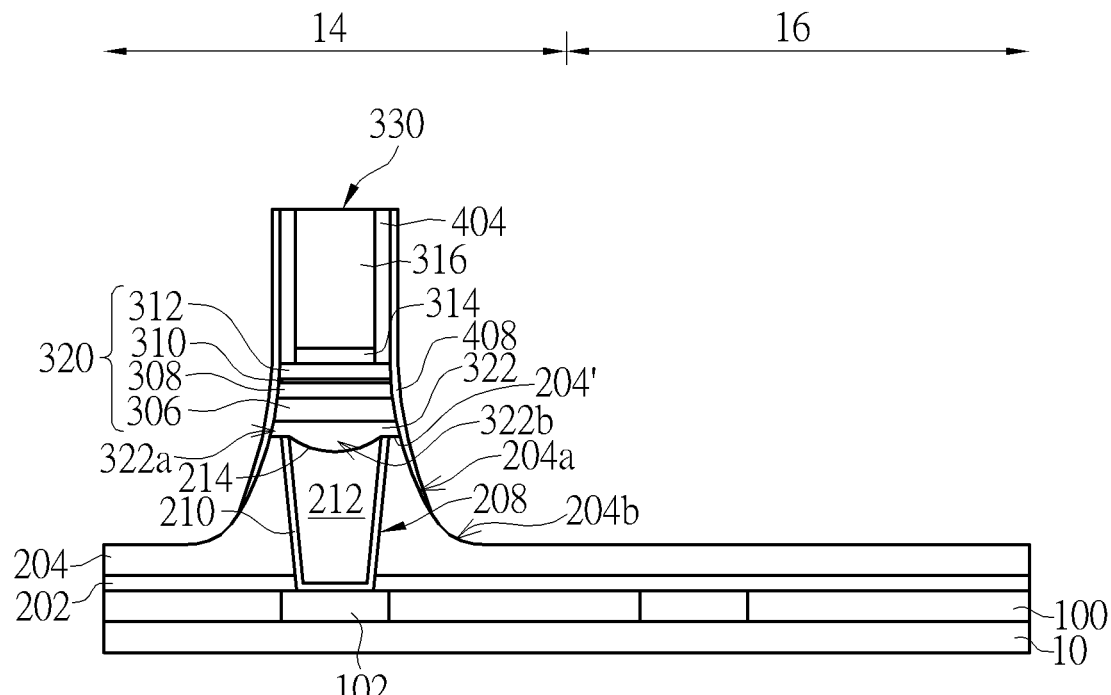

Please refer to FIG. 8. Afterward, a second etching process, such as a reactive ion etching (RIE) process is performed, using the top electrode 330 and the first spacer 404 as an etching mask to anisotropically etch the second spacer material layer 406 until exposing the first dielectric layer, thereby forming a second spacer 408 that is self-aligned to and conformally covers the sidewall of the first spacer 404, the sidewall of the MTJ 320 and the sidewall of the bottom electrode 322, and continuously covers the taper portion of the first recessed top surface 204a of the first dielectric layer 204. T first etching process the second spacer 408 may function as a passivation layer to protect the sidewall of the MTJ 320 from being damaged or contaminated during subsequent fabricating processes. As previously illustrated, by forming a taper portion of the first recessed top surface 204a, the second spacer 408 may extend downwardly, continuously covering along the taper portion of the first recessed top surface 204a. In this way, the passivation of the bottom corner of the MTJ 320 is better guaranteed.

Notably, the first dielectric layer 204 exposed from the second spacer 408 is over-etched by the second etching process to form a second recessed top surface 204b that borders the remaining portion (taper portion) of the first recessed top surface 204a covered by the second spacer 408 and extends downwardly to a level lower than the first recessed top surface 204a. Similarly, the sidewall of the second spacer 408 and the second recessed top surface 204b of the first dielectric layer 204 collectively form a continuous curved surface. The over-etched thickness of the first dielectric layer 204 during the second etching process has to be sufficient to ensure that the remaining second spacer material layer 406 in the peripheral region 16 is completely removed. According to an embodiment, the over-etched thickness of the first dielectric layer 204 during the second etching process may range from 0 to 100 angstroms.

Figure 9:
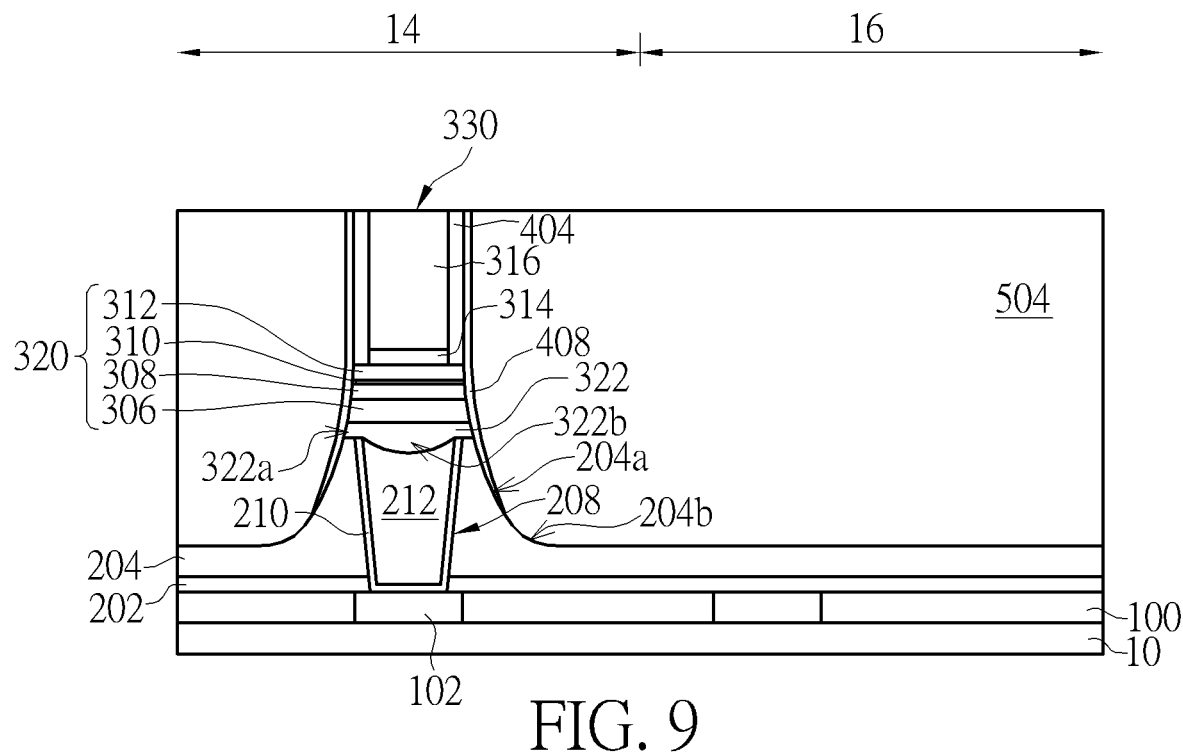

Please refer to FIG. 9. Following, a second dielectric layer 504 is formed on the substrate 10, completely covering the top electrode 330, the second spacer 408 and the first dielectric layer 204. A planarization process such as a chemical mechanical polishing (CMP) process may be performed to remove a portion of the second dielectric layer 504 until the top surface of the top electrode 330 is exposed and a planar top surface of the second dielectric layer 504 is obtained. The exposed top surface of the top electrode 330 is coplanar with the planar top surface of the second dielectric layer 504. As shown in FIG. 9, the top electrode 330 and the cap layer 314 are spaced apart from the second dielectric layer 504 by the first spacer 404 and the second spacer 408. The MTJ 320, the bottom electrode 322 and the remaining first recessed top surface 204a of the first dielectric layer 204 covered by the second spacer 408 are spaced apart from the second dielectric layer 504 by the second spacer 408. The second recessed top surface 204b of the first dielectric layer 204 is in direct contact with the second dielectric layer 504.

Figure 10:
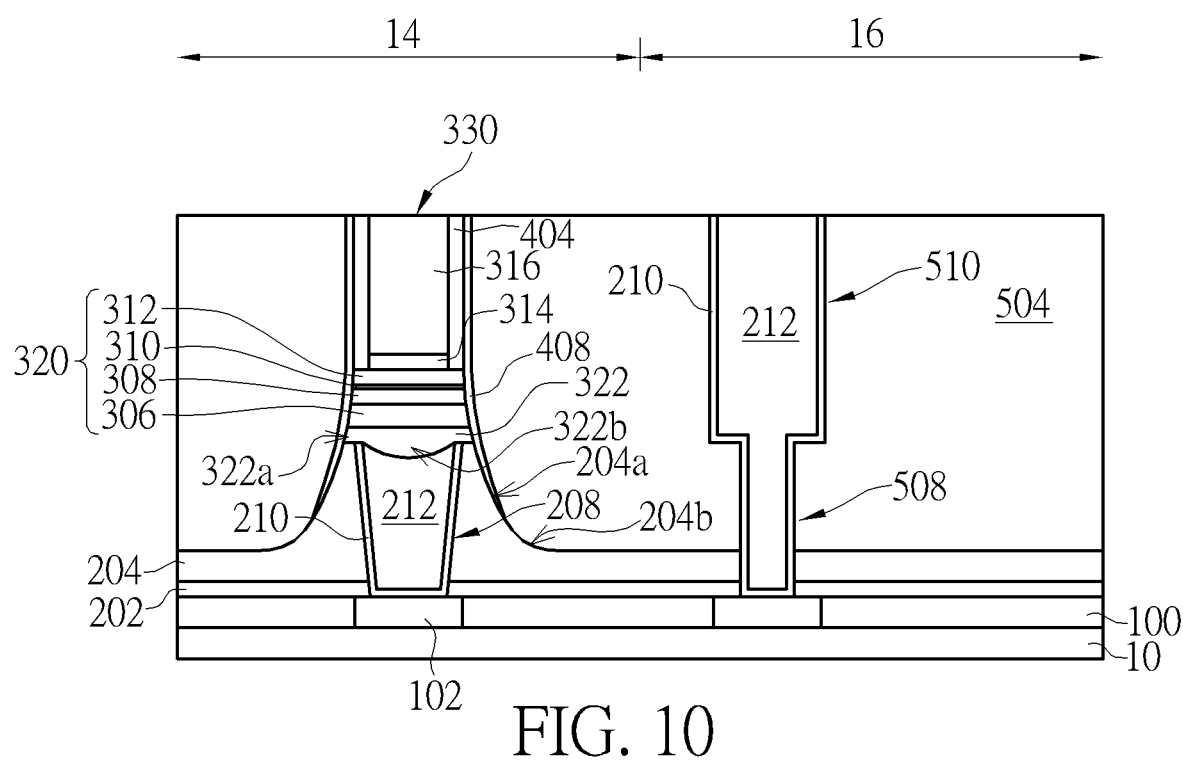

Please refer to FIG. 10. Afterward, a contact plug 508 and an interconnecting structure 510 may be formed in the first dielectric layer 204 and the second dielectric layer 504 and electrically coupled to the bottom interconnecting structures 102 in the peripheral region 16. According to an embodiment, the contact plug 508 and the interconnecting structure 510 may be formed integrally and comprise a same material. For example, after planarizing the second dielectric layer 504, a dual-damascene trench (not shown) is formed in the peripheral region 16 and penetrating through the second dielectric layer 504, the first dielectric layer 204 and the etching stop layer 202 in the peripheral region 16 to exposes a top surface of the bottom interconnecting structure 102 in the peripheral region 16. After forming a barrier layer 210 conformally covering the sidewall of the dual-damascene trench and the exposed top surface of the bottom interconnecting structures 102, a conductive material 212 is then formed to completely fill the dual-damascene trench. A chemical mechanical polishing process may be performed to remove unnecessary barrier layer 210 and conductive material 212 outside the dual-damascene trench, and the barrier layer 210 and the conductive material 212 remaining in the dual-damascene trench become the contact plug 508 and the interconnecting structure 510. According to an embodiment, the barrier layer 210 may be made of titanium, tantalum, titanium nitride, tantalum nitride, or a combination thereof, but not limited thereto. The conductive material 212 may be made of tungsten, copper, aluminum or other suitable low-resistance metal, but not limited thereto. Preferably, the conductive material 212 comprise copper. Subsequently, another interlayer dielectric layer (not shown) may be formed on the substrate 10 and completely covering the second dielectric layer 504, the top electrode 330 in the cell region 14 and the interconnecting structure 510 in the peripheral region 16. Upper interconnecting structures (not shown) may be formed in the interlayer dielectric layer over the top electrode 330 and the interconnecting structure 510 to electrically connect to the top electrode 330 and the interconnecting structure 510, respectively.

Overall, the present invention provides an improved magnetoresistance device and the manufacturing method, which forms the MTJ and the bottom electrode by using the top electrode and the first spacer on sidewalls of the top electrode as an etching mask. In this way, without increasing the process complexity or additional photomasks, the bottom electrode may have a larger width to be able to completely cover the underlying contact plug. A largest contacting area between the bottom electrode and the underlying contact plug may be achieved. The risk of exposing the contact plug to any etching process and tool contamination may also be reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A magnetoresistance device, comprising:
a first dielectric layer;
a bottom electrode on the first dielectric layer;
a magnetic tunneling junction disposed on the bottom electrode;
a top electrode disposed on the magnetic tunneling junction;
a first spacer disposed on the magnetic tunneling junction and covering a sidewall of the top electrode; and
a second spacer disposed on the first spacer and conformally covering a sidewall of the first spacer, a sidewall of the magnetic tunneling junction and a sidewall of the bottom electrode, wherein the first dielectric layer has a top surface vertically overlapped by the bottom electrode, a first recessed top surface bordering the top surface and extending downwardly to be lower than the top surface, and a second recessed top surface bordering an edge of the first recessed top surface and extending downwardly to be lower than the first recessed top surface.

2. The magnetoresistance device according to claim 1, wherein the magnetic tunneling junction comprises a pinned layer, a tunneling layer disposed on the pinned layer and a free layer disposed on the tunneling layer.

3. The magnetoresistance device according to claim 2, wherein the pinned layer and the free layer respective comprise a ferromagnetic material, the tunneling layer comprises an insulating material.

4. The magnetoresistance device according to claim 2, wherein the magnetic tunneling junction further comprises a pinning layer disposed between the pinned layer and the bottom electrode, and the magnetoresistance device further comprises a cap layer disposed between the free layer of the magnetic tunneling junction and the top electrode.

5. The magnetoresistance device according to claim 1, wherein the first recessed top surface and the sidewall of the bottom electrode together form a first continuous curved surface, the second recessed top surface and a sidewall of the second spacer together form a second continuous curved surface.

6. The magnetoresistance device according to claim 1, further comprising a contact plug disposed in the first dielectric layer and electrically coupled to the bottom electrode.

7. The magnetoresistance device according to claim 6, wherein the bottom electrode has a saucer-plate-shaped cross-sectional profile comprising an edge portion vertically overlapping the top surface of the first dielectric layer and a central portion vertically overlapping a recessed top surface of the contact plug.

8. The magnetoresistance device according to claim 1, further comprising a second dielectric layer disposed on the first dielectric layer, wherein a top surface of the second dielectric layer is coplanar with a top surface of the top electrode, wherein the first recessed top surface of the first dielectric layer is not in direct contact with the second dielectric layer, wherein the second recessed top surface of the first dielectric layer is in direct contact with the second dielectric layer.

9. The magnetoresistance device according to claim 1, wherein the top electrode has a width smaller than a width of the magnetic tunneling junction and a width of the bottom electrode.

10. A method for forming a magnetoresistance device, comprising:
   providing a first dielectric layer;
   forming a bottom electrode layer on the first dielectric layer and a magnetic tunneling junction material layer on the bottom electrode layer;
   forming a top electrode on the magnetic tunneling junction material layer;
   forming a first spacer material layer conformally covering the top electrode and the magnetic tunneling junction material layer;
   performing a first etching process to etch the first spacer material layer, the magnetic tunneling junction material layer and the bottom electrode layer until exposing the first dielectric layer, thereby forming a magnetic tunneling junction, a bottom electrode and a first spacer disposed on the magnetic tunneling junction and covering a sidewall of the top electrode;
   forming a second spacer material layer conformally covering the first spacer, the magnetic tunneling junction, the bottom electrode and the first dielectric layer; and
   performing a second etching process to etch the second spacer until exposing the first dielectric layer, thereby forming a second spacer covering on a sidewall of the first spacer, a sidewall of the magnetic tunneling junction and a sidewall of the bottom electrode.

11. The method for forming a magnetoresistance device according to claim 10, wherein the magnetic tunneling junction material layer comprises a pinned layer, a tunneling layer disposed on the pinned layer and a free layer disposed on the tunneling layer.

12. The method for forming a magnetoresistance device according to claim 10, wherein the first etching process comprises:
   etching the first spacer to form the first spacer covering the sidewall of the top electrode and a portion of the magnetic tunneling junction material layer adjacent to the sidewall of the top electrode; and
   using the top electrode and the first spacer as an etching mask to etch the magnetic tunneling junction material layer and the bottom electrode layer to form the magnetic tunneling junction and the bottom electrode.

13. The method for forming a magnetoresistance device according to claim 10, wherein the first spacer and the second spacer comprise a same material.

14. The method for forming a magnetoresistance device according to claim 10, wherein the first etching process and the second etching process over-etch the first dielectric layer to form a first recessed top surface and a second recessed top surface, respectively, wherein the first recessed top surface is lower than a top surface of the dielectric layer vertically overlapped by the bottom electrode and the second recessed top surface is lower than the first recessed top surface.

15. The method for forming a magnetoresistance device according to claim 14, wherein the first recessed top surface and the sidewall of the bottom electrode together form a first continuous curved surface, the second recessed top surface and a sidewall of the second spacer form a second continuous curved surface.

16. The method for forming a magnetoresistance device according to claim 14, further comprising:
   forming a second dielectric layer on the first dielectric layer; and
   performing a polishing process to the second dielectric layer until a top surface of the top electrode is exposed.

17. The method for forming a magnetoresistance device according to claim 16, wherein the first recessed top surface is not in direct contact with the second dielectric layer, the second recessed top surface is in direct contact with the second dielectric layer.

18. The method for forming a magnetoresistance device according to claim 10, further comprising:
   defining a contact opening in the first dielectric layer;
   forming a conductive material completely filling the contact opening;
   removing the conductive material outside the contact opening, wherein the conductive material remaining in the contact opening forms a contact plug; and
   forming the bottom electrode layer on the first dielectric layer and the contact plug.

19. The method for forming a magnetoresistance device according to claim 18, wherein the bottom electrode has a saucer-plate-shaped cross-sectional profile comprising an edge portion vertically overlapping the top surface of the first dielectric layer and a central portion vertically overlapping a recessed top surface of the contact plug.

* * * * *